(12) United States Patent
Iizuka et al.

(10) Patent No.: US 8,730,449 B2
(45) Date of Patent: May 20, 2014

(54) OPTICAL DEVICE AND DEVICE MANUFACTURING METHOD

(75) Inventors: Naoya Iizuka, Utsunomiya (JP);
Fumitaro Masaki, Utsunomiya (JP);
Akira Miyake, Nasukarasuyama (JP)

(73) Assignee: Canon Kabushiki Kaisha (JP)

( * ) Notice: Subject to any disclaimer, the term of this patent is extended or adjusted under 35 U.S.C. 154(b) by 465 days.

(21) Appl. No.: 13/029,386

(22) Filed: Feb. 17, 2011

(65) Prior Publication Data
US 2011/0222042 A1    Sep. 15, 2011

(30) Foreign Application Priority Data

Mar. 9, 2010    (JP) ................................. 2010-052195

(51) Int. Cl.
*G03B 27/42*    (2006.01)

(52) U.S. Cl.
USPC ..................... 355/53; 355/63; 355/71; 355/77

(58) Field of Classification Search
USPC ............ 355/53, 63, 71, 77; 356/328; 359/571
See application file for complete search history.

(56) References Cited

U.S. PATENT DOCUMENTS

| | | | |
|---|---|---|---|
| 7,436,490 B2 | 10/2008 | Miyake | |
| 2005/0236585 A1* | 10/2005 | Miyake | ........................ 250/492.2 |
| 2009/0022036 A1 | 1/2009 | Ide et al. | |

FOREIGN PATENT DOCUMENTS

| | | |
|---|---|---|
| JP | 2004264446 A | 9/2004 |
| JP | 2005-302998 A | 10/2005 |
| WO | 03/081712 A2 | 10/2003 |

OTHER PUBLICATIONS

Office Action issued in Counterpart Japanese Patent Application No. 2010-052195 dated Jan. 7, 2014.

* cited by examiner

*Primary Examiner* — Steven H Whitesell Gordon
*Assistant Examiner* — Mesfin T Asfaw
(74) *Attorney, Agent, or Firm* — Rossi, Kimms & McDowell LLP

(57) ABSTRACT

An optical device includes a wavelength separation filter configured to separate incident light into light having a first wavelength and light having a second wavelength, the wavelength separation filter including a blazed grating whose cross-sectional shape is a saw-tooth shape formed by one-dimensionally arranging a plurality of grating elements, wherein the blazed grating is configured to exert a first power on the light having the first wavelength, of the light having the first wavelength and the light having the second wavelength, by gradually changing angles surfaces of the plurality of grating elements make with a base plane, and to exert a second power on the light having the second wavelength, of the light having the first wavelength and the light having the second wavelength, by gradually changing lengths of the plurality of grating elements along a direction in which the plurality of grating elements are arranged.

9 Claims, 8 Drawing Sheets

OPTICAL DEVICE AND DEVICE MANUFACTURING METHOD

BACKGROUND OF THE INVENTION

1. Field of the Invention

The present invention relates to an optical device and device manufacturing method.

2. Description of the Related Art

An EUV exposure apparatus using EUV light is known. A plasma light source can be used as an EUV light source for generating EUV light. Examples of the method of the EUV light source are the laser produced plasma (LPP) method and discharge produced plasma (DPP) method. In the laser produced plasma method, for example, a high-temperature plasma is generated by irradiating a target material placed in a vacuum vessel with high-intensity pulsed laser light, and the generated plasma is used as a light source. The plasma emits EUV light having a wavelength of, for example, about 13.5 nm. A metal, inert gas, or the like is used as the target material. To increase the average intensity of the EUV light emitted from the target, the repetition frequency of the pulsed laser is desirably high, and the operation is normally performed at a repetition frequency of a few kHz. A condenser mirror is used to efficiently utilize the EUV light emitted from the target. As the condenser mirror, it is possible to use, for example, a multilayer mirror obtained by alternately stacking about 60 molybdenum and silicon films, or an oblique incidence mirror coated with a metal.

An illumination optical system of the EUV exposure apparatus includes, for example, a plurality of multilayer mirrors and an optical integrator. The optical integrator has a function to uniformly illuminate a reticle (original) with a predetermined numerical aperture. Collimated EUV light enters the optical integrator and generates a secondary light source at the focal point.

The EUV light supplied from the illumination optical system is reflected by the reticle, and reduced to ¼ by a projection optical system including, for example, six to eight multilayer mirrors. The reduced EUV light irradiates a wafer (substrate) coated with a resist. The reticle and wafer are respectively held by a reticle stage and wafer stage, and synchronously scanned at a speed ratio proportional to the reduction magnification. In this manner, the operation of synchronously scanning the reticle and wafer while the reduced projected image of the reticle is formed on the wafer is repeated (step-and-scan). Thus, the reticle pattern is transferred onto the entire surface of the wafer.

The EUV light source generates not only the EUV light having the desired wavelength, but also light having an unnecessary wavelength from the infrared region to the X-ray region. This light having the unnecessary wavelength is called OoB light (Out of Band light). The OoB light acts as flare and decreases the contrast of light on the wafer or thermally expands the wafer. Also, the OoB light raises the temperature of a mirror, and this poses a problem concerning a mirror of particularly a projection system. The LPP light source poses the problem of scattered light from a $CO_2$ laser for use in plasma excitation. This scattered light contains infrared light having a wavelength of 10.6 μm, and this infrared light thermally expands the reticle or wafer, degrades the imaging performance, or decreases the overlay accuracy.

As a method of removing the OoB light in the infrared region, there is a method of incorporating a wavelength separation filter as an additional optical element in the light source or the illumination optical system of the exposure apparatus. There is also a method of separating light generated by a light source into EUV light and infrared light by inserting a reflection blazed grating as the wavelength separation filter in an optical path. The surface of the blazed grating is coated with a multilayer film for reflecting EUV light. The blazed grating causes diffraction in a direction corresponding to the wavelength of incident light. Therefore, the blazed grating can separate EUV light and infrared light by guiding them in different directions (Japanese Patent Laid-Open No. 2005-302998).

In the conventional apparatus, however, a light amount loss corresponding to the reflectance of the grating surface of the wavelength separation filter to the EUV light is produced because the wavelength separation filter is additionally installed in the light source or illumination optical system. Also, the OoB light reflected by the wavelength separation filter may scatter inside the exposure apparatus and warm mirrors and a chamber of the illumination system, a wafer, and the like. Accordingly, demands have arisen for an optical device that separates light having a first wavelength from light having a second wavelength and exerting different powers on these light components.

SUMMARY OF THE INVENTION

The present invention provides a technique advantageous in separating light having a first wavelength from light having a second wavelength and exerting different powers on these light components.

One of aspects of the present invention provides an optical device comprising a wavelength separation filter configured to separate incident light into light having a first wavelength and light having a second wavelength, the wavelength separation filter comprising a blazed grating whose cross-sectional shape is a saw-tooth shape formed by one-dimensionally arranging a plurality of grating elements, wherein the blazed grating is configured to exert a first power on the light having the first wavelength, of the light having the first wavelength and the light having the second wavelength, by gradually changing angles surfaces of the plurality of grating elements make with a base plane, and to exert a second power on the light having the second wavelength, of the light having the first wavelength and the light having the second wavelength, by gradually changing lengths of the plurality of grating elements along a direction in which the plurality of grating elements are arranged.

Further features of the present invention will become apparent from the following description of exemplary embodiments with reference to the attached drawings.

DESCRIPTION OF THE EMBODIMENTS

Figure 12:
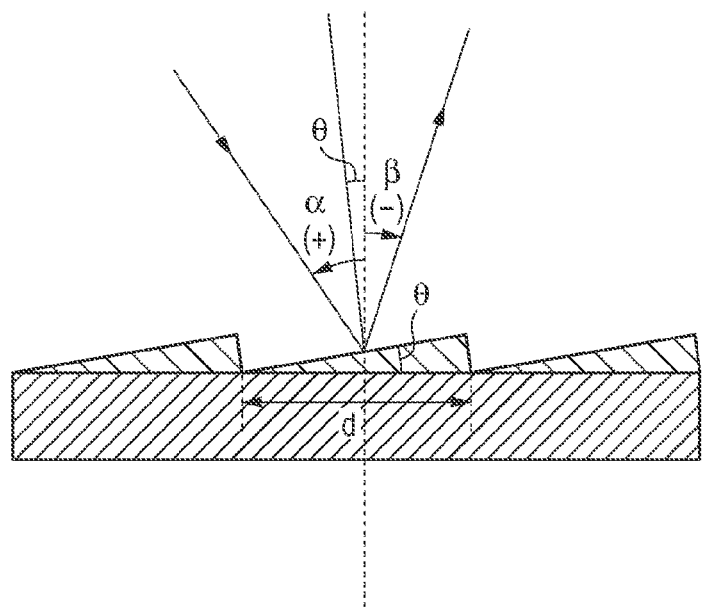
FIG. 12 is a view showing a general wavelength separation filter.

A general blazed grating will be explained below with reference to FIG. 12. The cross-section of the blazed grating has a saw-tooth shape. Letting d be the grating pitch of the blazed grating, $\alpha$ be the incident angle of incident light, $\beta$ be the exit angle of diffracted light, $\theta$ be the blaze angle, and $\lambda$ be the wavelength of the incident light, the relationship of equation (1) holds. Note that the incident angle $\alpha$ is the angle a normal n of the blazed grating makes with the incident light, and the exit angle $\beta$ is the angle the normal n makes with the diffracted light.

$$d \times (\sin\alpha + \sin\beta) = m \times \lambda \quad (1)$$

where m is an integer representing the diffraction order. Equation (2) represents the blaze condition, and the diffraction intensity of a diffraction order meeting this condition is maximum.

$$\alpha + \beta = 2 \times \theta \quad (2)$$

An optical device of the present invention includes a wavelength separation filter for separating incident light into light having a first wavelength and light having a second wavelength. This optical device can be, for example, an exposure apparatus for transferring an original pattern onto a substrate, an illumination optical system of the exposure apparatus, or a part (for example, a mirror) of the illumination optical system. Alternatively, the optical device can be any device or element required to have a function of separating incident light into the light having the first wavelength and the light having the second wavelength. The optical device can also be the wavelength separation filter itself. In a typical embodiment, the light having the first wavelength is EUV light, and the light having the second wavelength is OoB light such as infrared light.

A case in which the present invention is applied to an EUV exposure apparatus will be explained below, but this does not intend the understanding that the present invention is applicable to only an EUV exposure apparatus. The object of the present invention is to separate the light having the first wavelength from the light having the second wavelength and exert different powers on these light components, and the present invention is provided to any optical device having this function.

The cross-sectional shape of a blazed grating of an embodiment of the present invention has a saw-tooth shape formed by one-dimensionally arranging a plurality of grating elements. Grating parameters of the blazed grating are set such that infrared light has a high diffraction intensity at a low diffraction order. When EUV light enters the blazed grating like this, the spread of an angle caused by diffraction is very small because the wavelength is as small as about 1/1000 the grating pitch. When EUV light enters the blazed grating at the same incident angle as that of infrared light, therefore, the diffraction angle at a diffraction order at which the diffraction intensity of the EUV light is maximum is almost a specular reflection angle to the slope of the blazed grating. The grating condition of the blazed grating is set such that the diffraction angle of infrared light is an angle other than the specular reflection angle to the grating slope. EUV light and infrared light diffracted by the blazed grating are separated from each other as they propagate in different directions. To prevent infrared light from warming members such as a chamber, mirror, and mirror holder of the exposure apparatus, an absorber for absorbing the reflected infrared light is formed. The absorber is installed in a position where the absorber does not intercept the optical path of EUV light.

The exposure apparatus is preferably small. For this purpose, downsizing the individual parts forming the exposure apparatus facilitates design because the degree of freedom of the layout increases. To downsize the absorber, infrared light to be diffracted by the blazed grating must be condensed. From the diffraction condition indicated by equation (1), the diffraction angle $\beta$ can be changed by changing the grating length d when the wavelength $\lambda$, diffraction order m, and incident angle $\alpha$ are constant. The grating length herein mentioned is the length of each of the plurality of grating elements along the arrangement direction of these grating elements. Note that as in conventional gratings, when the grating length is constant, the grating length has the same meaning as that of the grating pitch.

In the blazed grating of the embodiment of the present invention, the grating length d gradually changes in the plane, so the diffraction angle of infrared light entering each position in the plane gradually changes. That is, in the blazed grating of the embodiment of the present invention, the grating length d gradually changes, and this makes it possible to exert a positive power on infrared light, that is, condense infrared light.

In the blazed grating of the embodiment of the present invention, the angle the surface of each of the plurality of grating elements makes with a base plane (for example, a plane perpendicular to the normal of the blazed grating) gradually changes. This can be done by, for example, gradually changing the blaze angles of the plurality of grating elements. EUV light is diffracted in the direction of specular reflection with respect to the grating slope. Therefore, it is possible to exert a positive power on EUV light, that is, condense EUV light by gradually changing the blaze angle. When given a function of condensing EUV light, the blazed grating can also be used as a mirror of an illumination optical system. If the blazed grating is not used as a mirror but installed in addition to a mirror for generating illumination light of an illumination optical system, a light amount loss corresponding to the reflectance of the grating slope to EUV light occurs. When the blazed grating is installed to also function as a mirror for generating illumination light of an illumination optical system, EUV light and infrared light can be separated while the loss of the EUV light is decreased. To gradually change the angle the surface of each of the plurality of grating elements makes with the base plane, it is also possible to one-dimensionally arrange the plurality of grating elements on a curved surface of a substrate having the curved surface.

The blazed grating of the embodiment of the present invention has a second power for condensing infrared light because the grating length gradually changes, and a first power for condensing EUV light because the angle the surface of each of the plurality of grating elements makes with the base plane gradually changes.

When a large infrared light absorber can be installed, although it may be a special form, it is possible to feed infrared light to the infrared light absorber by exerting a negative power on the infrared light, that is, spreading the bundle of rays of the infrared light. It is also possible to exert a negative power on EUV light in, for example, an illumination optical system. A negative power can also be generated by changing the direction in which the grating length changes, or the direction in which the angle the surface of each of the plurality of grating elements makes with the base plane changes.

Preferred embodiments of the present invention will be explained below.

[First Embodiment]

An exposure apparatus of the first embodiment of the present invention will be explained below with reference to FIG. 2. An exposure apparatus EX of the first embodiment transfers a circuit pattern formed on a reticle (original) 31 onto a wafer (substrate) 38 by, for example, the step-and-scan method by using EUV light (for example, the wavelength is 13.5 nm) as exposure light. The exposure apparatus EX includes an EUV light source LS, an illumination optical system IL, a projection optical system PS, a reticle driving mechanism 32, a wafer driving mechanism 39, an alignment optical system 37, and a chamber CH surrounding these components. The illumination optical system IL illuminates the reticle 31 held by the reticle driving mechanism 32, by using EUV light provided by the EUV light source LS. The projection optical system PS projects the reflected light from the reticle 31 onto the wafer 38 held by the wafer driving mechanism 39.

The EUV light source LS is, for example, an EUV light source using the laser produced plasma (LPP) method, and can be designed to use a $CO_2$ laser having a wavelength of 10.6 µm in order to cause plasma excitation. The laser produced plasma method herein mentioned is a method using EUV light having a wavelength of about 13.5 nm, which is emitted from a light source by generating a high-temperature plasma 13 by irradiating a target material set in a vacuum with high-intensity pulsed laser light emitted from a $CO_2$ laser device. The $CO_2$ laser for excitation is designed to condense the laser light to the target material. The target material is not limited to any specific material, and it is possible to use a thin metal film, inert gas, liquid droplet, or the like. For example, a liquid droplet made of tin can be used. The type or method of the EUV light source is not limited to any specific type or method, and any technique is applicable.

The illumination optical system IL is an optical system for illuminating the reticle 31 with EUV light, and can include a first mirror 20, optical integrator 21, wavelength separation filter 22, second mirror 23, and third mirror 24. The first mirror 20 feeds parallel EUV light to the optical integrator 21. The optical integrator 21 forms a plurality of secondary light sources for uniformly illuminating the reticle 31 with a predetermined numerical aperture. In addition to the EUV light, infrared light as parallel light enters the wavelength separation filter 22 via the first mirror 20 and optical integrator 21. The incident angle of the principal ray of the EUV light is set at a low incident angle, that is, 20° or less. This makes it possible to decrease a blur amount produced during condensation and increase the condensation efficiency, compared to an arrangement in which the incident angle is a high incident angle. Consequently, the illumination efficiency can be increased. The wavelength separation filter 22 has a function of condensing the EUV light, and a function of condensing the infrared light to a position different from the EUV light.

Figure 1A:
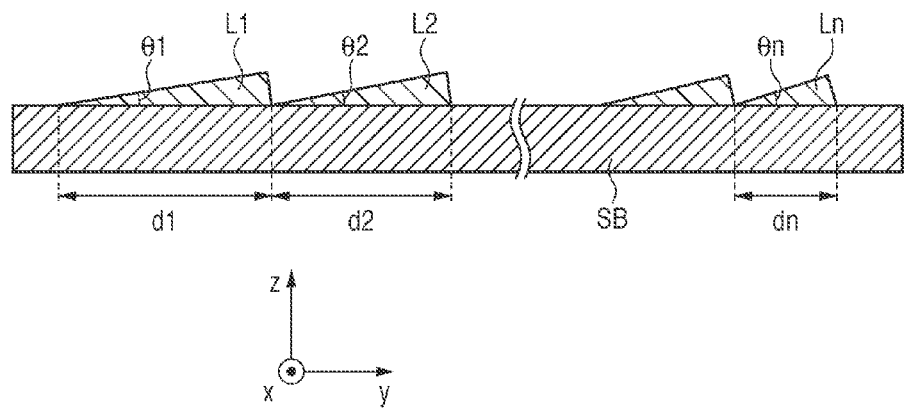
FIGS. 1A and 1B are views showing a wavelength separation filter of the first embodiment of the present invention.
Figure 1B:
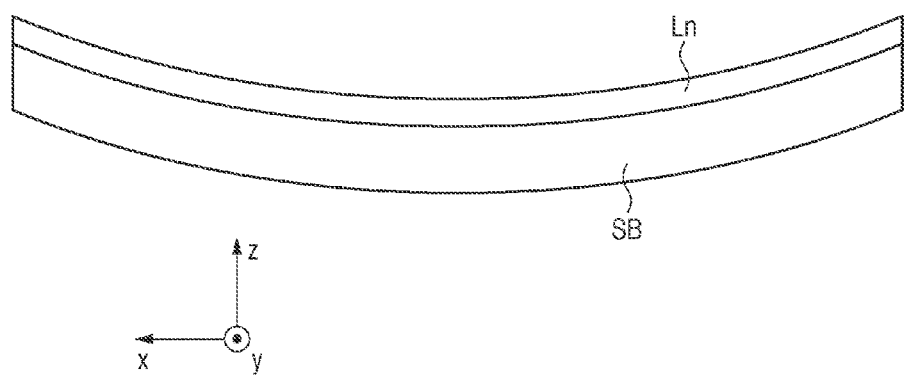

FIGS. 1A and 1B are schematic sectional views of the wavelength separation filter 22 used in the first embodiment. The wavelength separation filter 22 is a blazed grating. The wavelength separation filter 22 has a structure in which n grating elements L1, L2, ..., and Ln are one-dimensionally arranged on a substrate SB. Grating lengths d1, d2, ..., and dn of the blazed grating as the wavelength separation filter 22 gradually change, for example, gradually decrease such that d1>d2> ... >dn. Blaze angles θ1, θ2, ..., and θn also gradually change, for example, gradually increase such that θ1<θ2< ... <θn. In the example shown in FIGS. 1A and 1B, assuming that a base plane is the upper or lower surface of the substrate SB, the blaze angle is the angle the base plane makes with the surface of the grating element.

To increase the reflectance to the incident EUV light, the surface of the blazed grating (or each grating element) can have a multilayer film formed by alternately stacking, for example, molybdenum layers and silicon layers. The wavelength separation filter 22 has power for forming illumination light (EUV light) for illuminating the reticle 31. The wavelength separation filter 22 has a concave surface (reflecting surface) in a cross-section along the x-axis, and hence has a positive power for condensing the EUV light. The wavelength separation filter 22 has a structure in which the blaze angles θ1, θ2, ..., and θn gradually change in a cross-section along the y-axis, and hence has a positive power for condensing the EUV light.

In one configuration example, the diameter of a bundle of rays entering the wavelength separation filter 22 is, for example, 20 mm, and the incident angle is, for example, 15°. Also, the number n of the grating elements of the blazed grating as the wavelength separation filter 22 is 180, and the grating length gradually changes, for example, from 150 to 80 µm. That is, the grating length gradually changes such that d1 is 150 µm and d180 is 80 µm. Since the grating length gradually decreases, 10.6-µm infrared light enters the blazed grating at different diffraction angles in individual incidence positions on the surface of the diffraction grating.

The wavelength of 13.5-nm EUV light is about 1/10000 the grating length of the blazed grating of this configuration example. When this EUV light enters the blazed grating, therefore, the EUV light is reflected at almost a specular reflection angle with respect to the slopes of the grating elements L1, L2, ..., and Ln, because the spread of the angle caused by diffraction is sufficiently small. That is, the incident angle of the EUV light and the blaze angles θ1, θ2, ..., and θn determine the exit angle of the EUV light.

In this configuration example, the blaze angle of the blazed grating gradually changes from 3.1° to 5.7°. That is, θ1 is 3.1°, and θ180 is 5.7°. Since the blaze angle gradually increases, the exit angle of the EUV light changes from one incidence position to another on the surface of the blazed grating.

Figure 3:
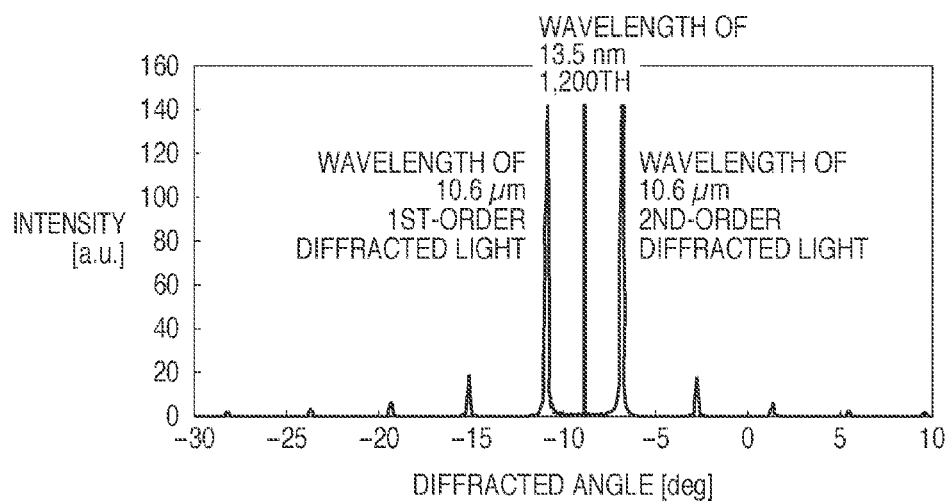
FIG. 3 is a graph showing the diffraction angle distribution of diffracted light formed by the wavelength separation filter of the first embodiment of the present invention.

When EUV light having a wavelength of 13.5 nm and infrared light having a wavelength of 10.6 µm enter the blazed grating as the wavelength separation filter 22 having the shape as described above at an incident angle of 15°, the reflected light behaves as follows. FIG. 3 shows the calculation result of the diffraction angle distribution of the infrared light having entered the grating element L1 having the grating length d1. The unit of the ordinate is an arbitrary unit. As shown in FIG. 3, the infrared light having a wavelength of 10.6 µm is diffracted so that the exit angles concentrate to −10.8° and −6.7°. The former corresponds to the first diffraction order, and the latter corresponds to the second diffraction order. On the other hand, the exit angle of the EUV light is −8.7°. This corresponds to about the 1,200th diffraction order.

Figure 4:
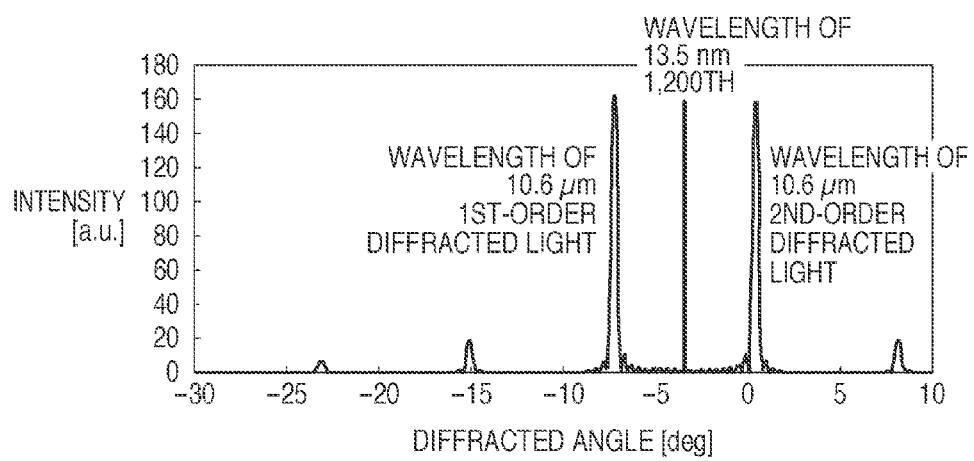
FIG. 4 is a graph showing the diffraction angle distribution of diffracted light formed by the wavelength separation filter of the first embodiment of the present invention.

Similarly, FIG. 4 shows the calculation result of the diffraction angle distribution of the infrared light having entered the grating element L180 having the grating length d180. As shown in FIG. 4, the infrared light having a wavelength of 10.6 µm is diffracted so that the exit angles concentrate to −7.3° and 0.35°. The former corresponds to the first diffraction order, and the latter corresponds to the second diffraction order. On the other hand, the exit angle of the EUV light is −3.4°. This corresponds to about the 1,200th diffraction order.

Figure 5:
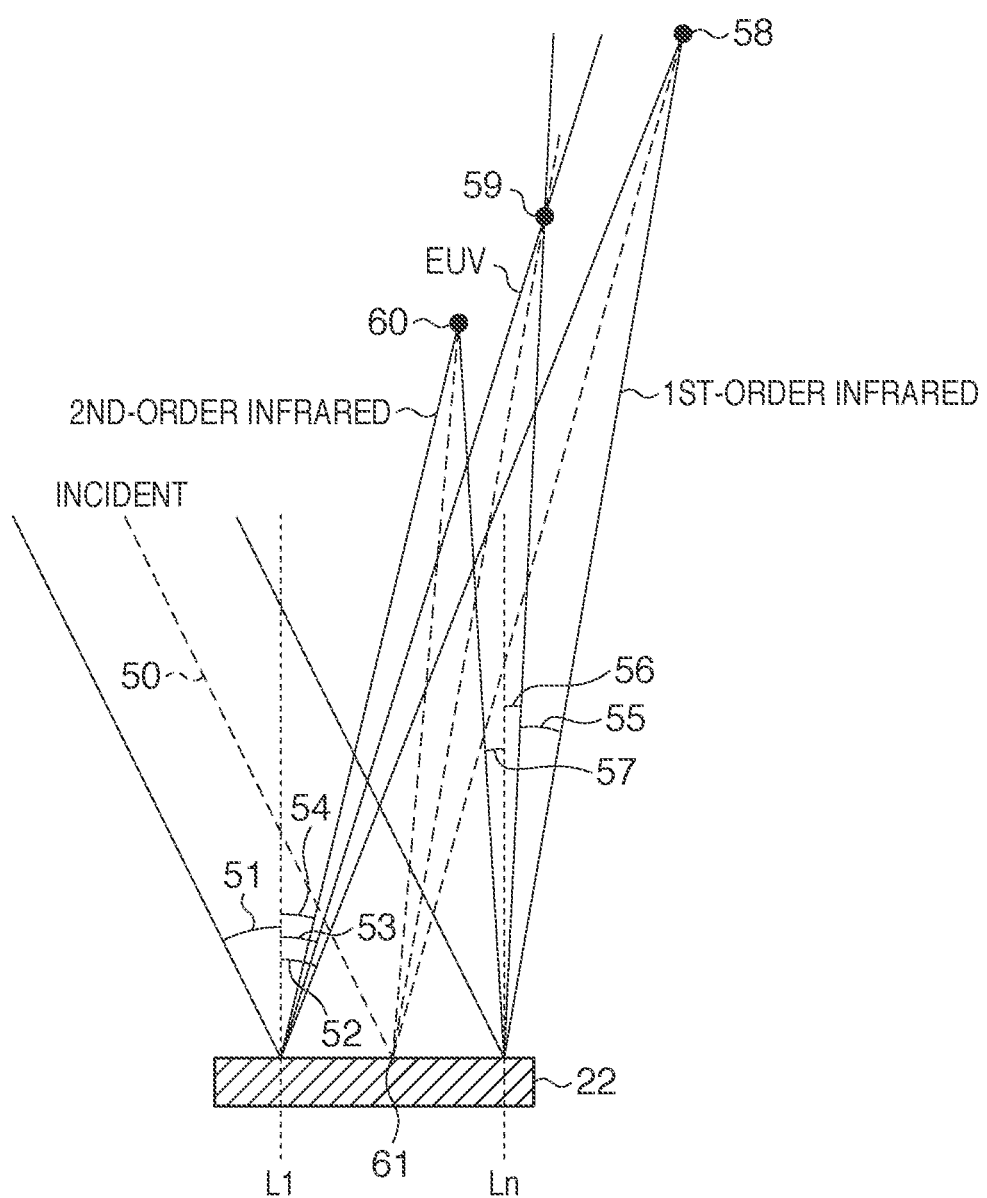
FIG. 5 is a view showing an outline of light separation by the wavelength separation filter of the first embodiment of the present invention.

FIG. 5 is a conceptual view showing EUV light and infrared light output from the wavelength separation filter 22 of this configuration example. Since the grating length gradually changes, the 1st- and 2nd-order diffracted light components of the infrared light receive the positive power. Also, the EUV light receives the positive power because the blaze angle gradually changes. On the surface of the grating element L1 having the grating length d1, the 1st-order diffracted light of the infrared light is reflected at an exit angle 52, the EUV light is reflected at an exit angle 53, and the 2nd-order diffracted light of the infrared light is reflected at an exit angle 54. On the surface of the grating element L180 having the grating pitch d180, the 1st-order diffracted light of the infrared light is reflected at an exit angle 55, the EUV light is reflected at an exit angle 56, and the 2nd-order diffracted light of the infrared light is reflected at an exit angle 57. In this configuration example, the exit angles 52, 53, 54, 55, 56, and 57 are respectively −10.8°, −8.7°, −6.7°, −7.3°, −3.4°, and 0.35°.

The 1st-order diffracted light of the infrared light output from the wavelength separation filter 22 has a condensation angle at which the light is condensed to a condensation point 58. The 2nd-order diffracted light of the infrared light has a condensation angle at which the light is condensed to a condensation point 60. The EUV light has a condensation angle at which the light is condensed to a condensation point 59. The focal lengths of the 1st-order diffracted light of the infrared light, the EUV light, and the 2nd-order diffracted light of the infrared light, that is, the distances from a point 61 at which a principal ray 50 of the incident bundle of rays enters the wavelength separation filter to the condensation points 58, 59, and 60 are respectively 340, 220, and 180 mm.

Figure 2:
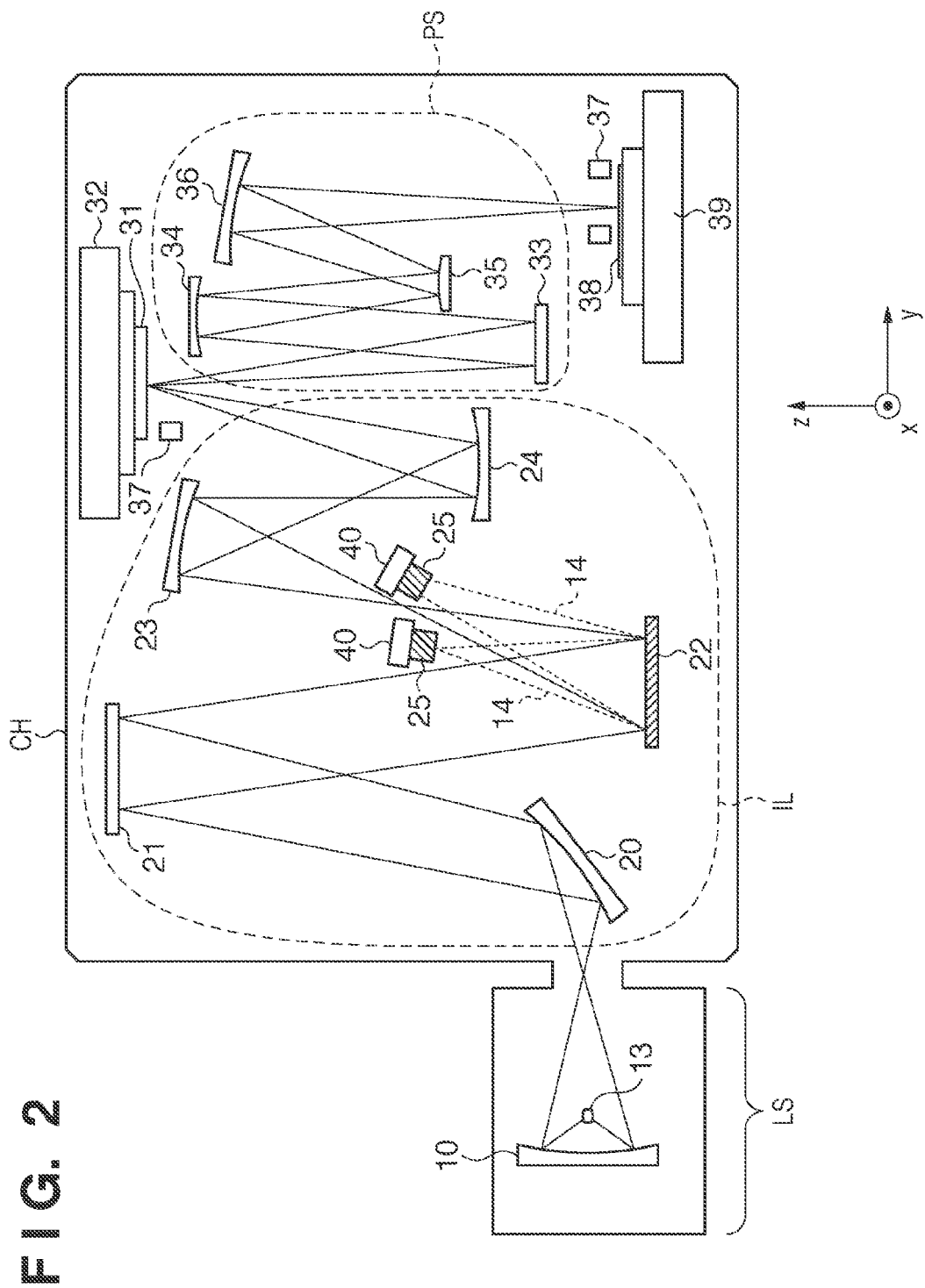
FIG. 2 is a view showing an exposure apparatus of the first embodiment of the present invention.

As exemplarily shown in FIG. 2, infrared light absorbers 25 arranged around the optical path of the EUV light reflected (diffracted) by the wavelength separation filter 22 absorb infrared light 14 separated from the EUV light as exposure light by the wavelength separation filter 22. This makes it possible to prevent the infrared light from entering the constituent elements such as the chamber CH and mirrors 20, 23, 24, and 33 to 36. The exposure apparatus EX can include coolers 40 for cooling the infrared light absorbers 25. Accordingly, it is possible to prevent the temperature of the infrared light absorbers 25 from rising beyond an allowable value.

The blazed grating is not limited to the above-mentioned parameters, and need only have parameters with which EUV light and infrared light are diffracted at different angles and condensed to different positions. By selecting arbitrary appropriate parameters, the condensation positions of EUV light and infrared light can be designed with a high degree of freedom.

[Second Embodiment]

Figure 6:
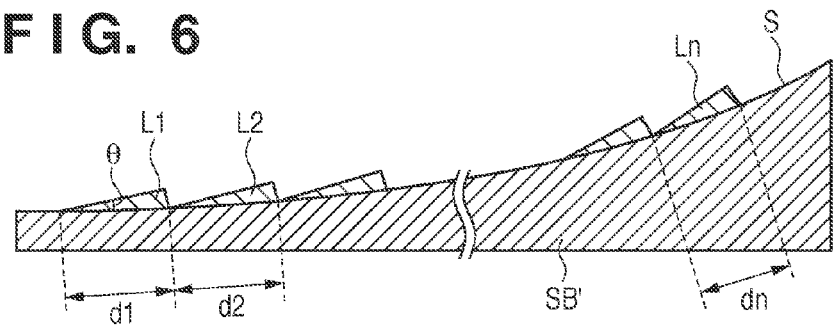
FIG. 6 is a view showing an exposure apparatus incorporating a wavelength separation filter of the second embodiment of the present invention.

The second embodiment of the present invention is an embodiment in which the arrangement of the wavelength separation filter of the first embodiment is changed. Matters not mentioned in the second embodiment are the same as those of the first embodiment. FIG. 6 is a schematic view showing the cross-sectional structure of a blazed grating as a wavelength separation filter 22 of the second embodiment. The wavelength separation filter 22 has a structure in which n grating elements L1, L2, . . . , and Ln are one-dimensionally arranged on a curved surface s of a substrate SB' having the curved surface s. Grating lengths d1, d2, . . . , and dn of the blazed grating according to the second embodiment gradually change, for example, gradually decrease such that d1>d2> . . . >dn. In the second embodiment, a blaze angle (in this embodiment, the angle the curved surface s makes with the surface of the grating element) θ is a constant angle for all the grating elements L1, L2, . . . , and Ln. The angles the surfaces of the plurality of grating elements make with a base plane (for example, a plane perpendicular to the normal of the blazed grating) gradually change in the second embodiment as well. To increase the reflectance to incident EUV light, the surface of the blazed grating (or each grating element) can have a multilayer film formed by alternately staking, for example, molybdenum layers and silicon layers.

In one configuration example of the second embodiment, parallel light having a beam diameter of 20 mm enters the blazed grating as the wavelength separation filter 22. In this configuration example, the number n of grating elements of the blazed grating is 270, and the grating length gradually changes from 100 to 50 µm. That is, the grating length gradually changes such that d1 is 100 µm and d270 is 50 µm. Since the substrate SB' of the blazed grating of the second embodiment has the curved surface s, the incident angle of light changes in accordance with a position on the blazed grating. The incident angle of light with respect to the grating element having the grating length d1 is, for example, 15°, and the incident angle of light with respect to the grating element having the grating length d270 is, for example, 10°. The blaze angle θ of all the grating elements is 2°.

Figure 7:
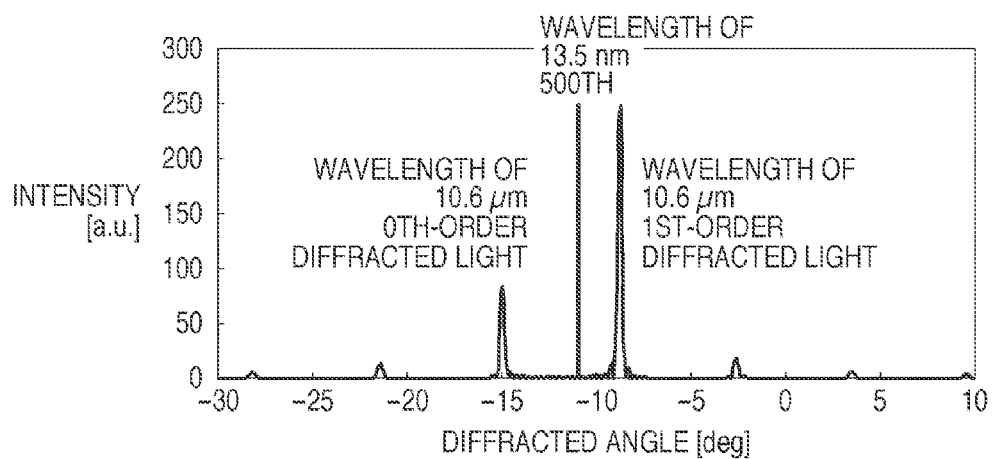
FIG. 7 is a graph showing the diffraction angle distribution of diffracted light formed by the wavelength separation filter of the second embodiment of the present invention.

FIG. 7 shows the calculation result of the diffraction angle distribution of infrared light entering the grating element having the grating length d1. As shown in FIG. 7, infrared light having a wavelength of 10.6 µm is diffracted so that the exit angles concentrate to −15° and −8.8°. The former corresponds to the 0th diffraction order, and the latter corresponds to the first diffraction order. On the other hand, the exit angle of EUV light is −11°. This corresponds to about the 500th diffraction order.

Figure 8:
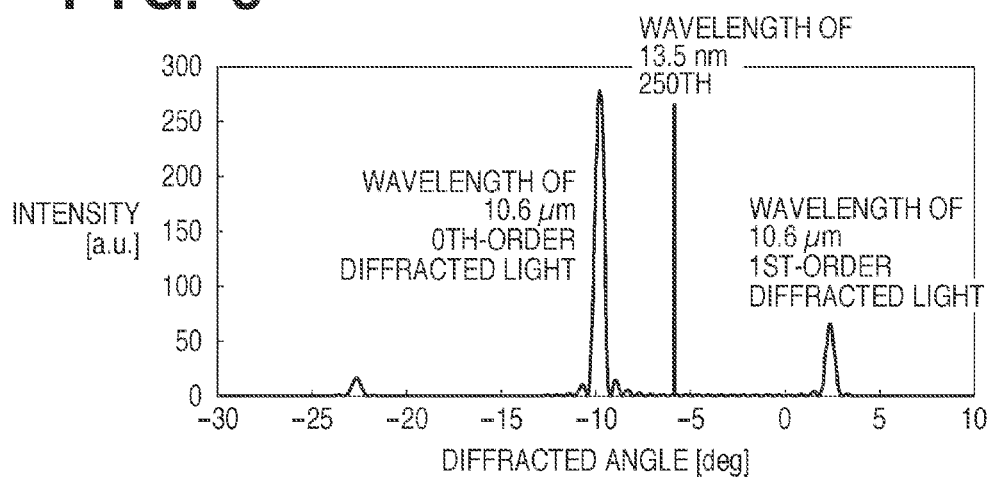
FIG. 8 is a graph showing the diffraction angle distribution of diffracted light formed by the wavelength separation filter of the second embodiment of the present invention.

Similarly, FIG. 8 shows the calculation result of the diffraction angle distribution of infrared light entering the grating element having the grating length d270. As shown in FIG. 8, infrared light having a wavelength of 10.6 µm is diffracted so that the exit angles concentrate to −10° and 2.2°. The former corresponds to the 0th diffraction order, and the latter corresponds to the first diffraction order. On the other hand, the exit angle of EUV light is −6°. This corresponds to about the 260th diffraction order.

Since the grating length gradually changes, the 0th- and 1st-order diffracted light components of the infrared light receive the positive power. Also, the EUV light receives the positive power because the plurality of grating elements L1, L2, . . . , and Ln are arranged on the curved surface s of the substrate SB'.

[Third Embodiment]

Figure 9:
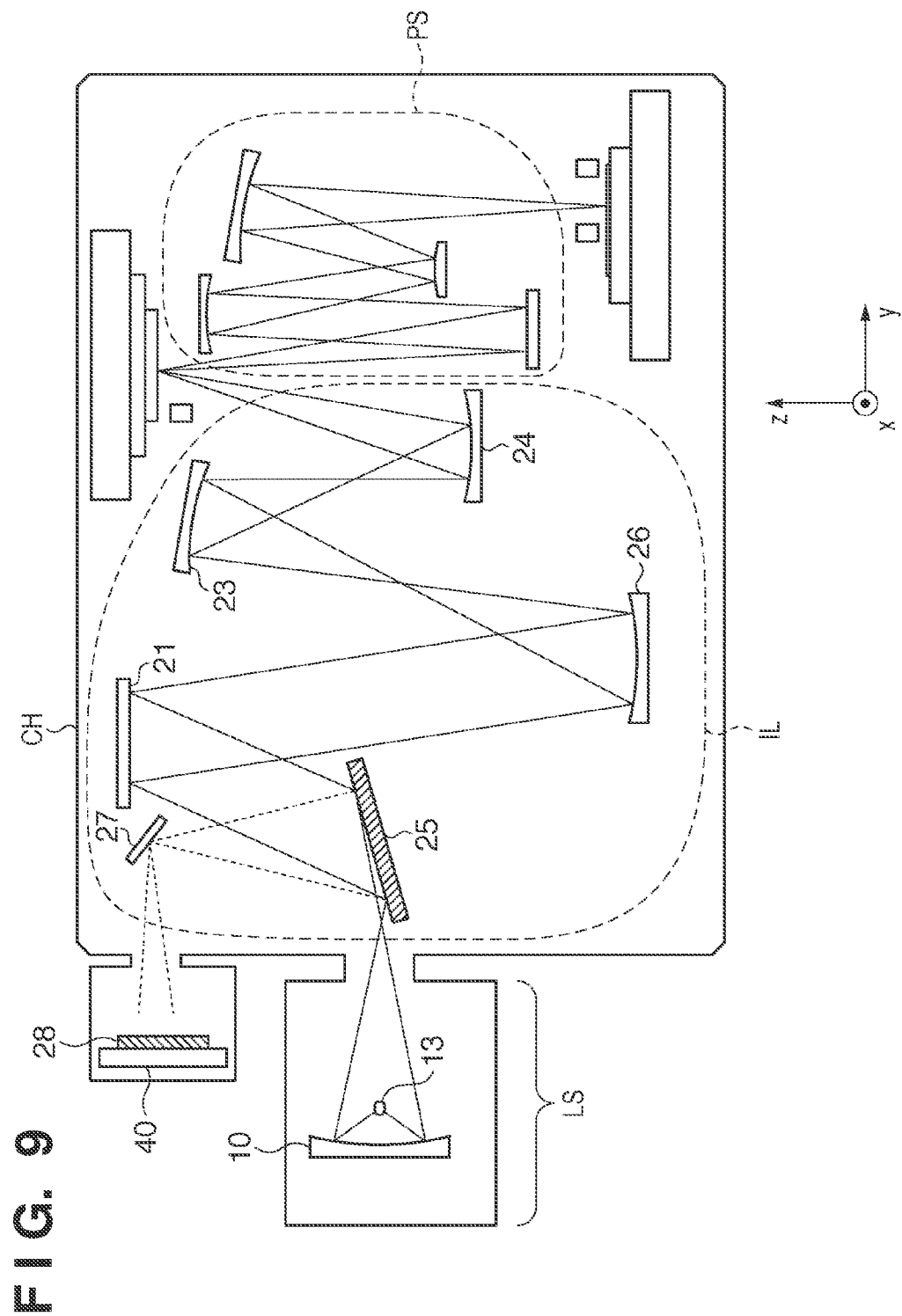
FIG. 9 is a view showing an exposure apparatus of the third embodiment of the present invention.

FIG. 9 is a conceptual view of an exposure apparatus according to the third embodiment of the present invention. Matters not mentioned in the third embodiment are the same as those of the first embodiment. A wavelength separation filter 25 is installed upstream of an optical integrator 21, and light obliquely enters the wavelength separation filter 25 at an angle of 70° or more. The surface of the wavelength separation filter 25 of the third embodiment is coated with a reflecting film made of a metal such as gold, platinum, molybdenum, ruthenium, or rhodium, or an alloy of any of these metals. As in the first embodiment, the wavelength separation filter 25 of the third embodiment has a structure in which the grating length and blaze angle gradually change. Accordingly, the bundles of rays of the 1st- and 2nd-order diffracted light components of infrared light are concentrated to predetermined positions, and EUV light is collimated to provide parallel light to the optical integrator 21.

An infrared light absorber 28 absorbs infrared light separated from EUV light by the wavelength separation filter 25. An optical system for guiding infrared light is different from an optical system for EUV light. A mirror having a high reflectance to infrared light having a wavelength of 10.6 µm is installed outside the optical path of EUV light, and guides infrared light separated by the wavelength separation filter 25 to the absorber 28 for absorbing the infrared light. The above arrangement alleviates the restriction on the installation position, for example, the restriction that the absorber 28 must be installed near the optical path of EUV light. Even when the temperature of the absorber 28 rises, therefore, it is possible to prevent the temperature of the absorber 28 from affecting a mirror for EUV light in an illumination optical system IL. An exposure apparatus EX can include a cooler 40 for cooling the infrared light absorber 28. This makes it possible to prevent the temperature of the infrared light absorber 28 from rising beyond an allowable value.

[Fourth Embodiment]

Figure 10:
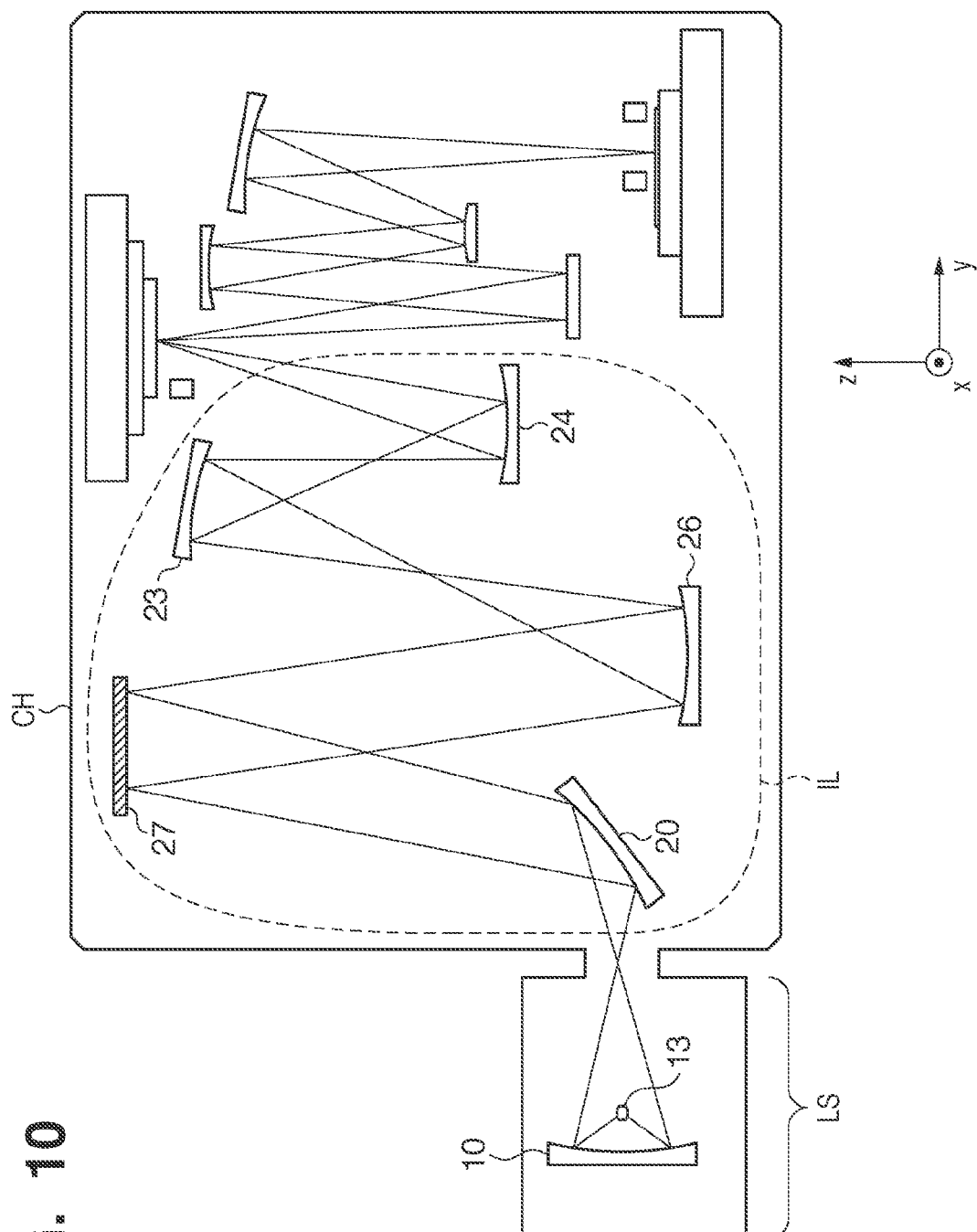
FIG. 10 is a view showing an exposure apparatus of the fourth embodiment of the present invention.

FIG. 10 is a conceptual view of an exposure apparatus according to the fourth embodiment of the present invention. Matters not mentioned in the fourth embodiment are the same as those of the first or second embodiment. A wavelength separation filter 27 of the embodiment also functions as an optical integrator (the optical integrator 21 of the first to third embodiments). The optical integrator forms a large number of secondary light sources of exposure light by arranging a large number of micro reflecting surfaces each having a predetermined curvature on a flat surface or curved surface, thereby uniformizing the intensity of light for illuminating a reticle.

Figure 11:
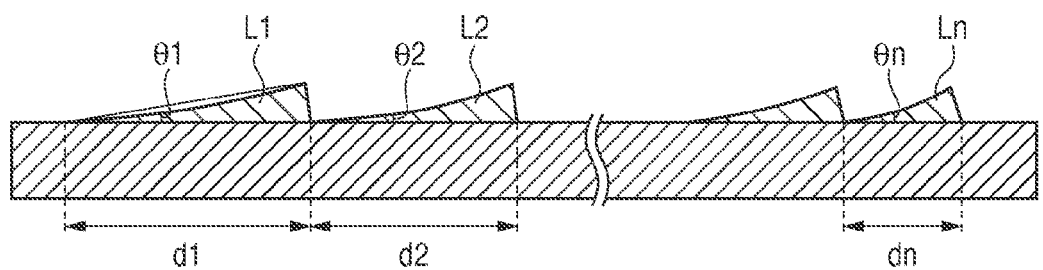
FIG. 11 is a view showing a wavelength separation filter of the fourth embodiment of the present invention.

FIG. 11 is a schematic view of the wavelength separation filter 27 incorporated into an optical device of the fourth embodiment of the present invention. As in the first embodiment, the wavelength separation filter 27 of the fourth embodiment has a structure in which the pitch and blaze angle gradually change. In addition, in the wavelength separation filter 27 of the fourth embodiment, the surfaces of grating elements L1, L2, . . . , and Ln each have a predetermined curvature. Since the grating elements L1, L2, . . . , and Ln have curvatures, the wavelength separation filter 27 achieves the same function as that of an optical integrator. The curvatures of the grating elements L1, L2, . . . , and Ln decrease in proportion to the grating lengths. More specifically, the grating elements have curvatures that equalize the convergent angles of EUV light reflected by the surfaces of these grating elements.

EUV light having entered the wavelength separation filter 27 of the fourth embodiment form a large number of secondary light sources near the wavelength separation filter 27 in accordance with the curvatures of the surfaces of the grating elements, thereby uniformizing the illuminance. On the other hand, since the grating lengths gradually change, infrared light is diffracted at condensation angles at which the bundle of rays of the 1st-order diffracted light and the bundle of rays of the 2nd-order diffracted light are condensed to predetermined positions, and is separated from EUV light. An infrared light absorber for absorbing infrared light can be installed in the fourth embodiment as well. In addition, it is also possible to install a cooler for preventing the temperature of the infrared light absorber from rising beyond an allowable value.

[Others]

A device manufacturing method of a preferred embodiment of the present invention is suited to the manufacture of devices such as a semiconductor device and liquid crystal device. The method can include the step of exposing a substrate coated with a photosensitive agent, by using the above-mentioned exposure apparatus, and the step of developing the exposed substrate. The device manufacturing method can further include other well-known steps (for example, oxidation, deposition, evaporation, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-052195, filed Mar. 9, 2010 which is hereby incorporated by reference herein in its entirety.

What is claimed is:

1. An optical device comprising:
a wavelength separation filter configured to separate incident light into light having a first wavelength and light having a second wavelength,
wherein the wavelength separation filter comprises a blazed grating whose cross-sectional shape is a sawtooth shape formed by arranging a plurality of grating elements along a predetermined direction,
wherein the blazed grating is configured to have a first power on the light having the first wavelength, by gradually changing blaze angles of the plurality of grating elements along the predetermined direction in which the plurality of grating elements are arranged, and have a second positive power of condensing the light having the second wavelength, by gradually changing lengths of the plurality of grating elements along the predetermined direction in which the plurality of grating elements are arranged.

2. The device according to claim 1, wherein the first power is a positive power of condensing the light having the first wavelength.

3. The device according to claim 1, wherein the blazed grating comprises the plurality of grating elements arranged on a curved surface of a substrate having the curved surface, and hence the angles the surfaces of the plurality of grating elements make with the base plane gradually change.

4. The device according to claim 1, wherein:
the light having the first wavelength is EUV light, and the light having the second wavelength is infrared light,
the optical device is configured as an exposure apparatus which exposes a substrate with the EUV light,
the optical device comprises an infrared light absorber which absorbs the infrared light, and
the blazed grating condenses the infrared light to the infrared light absorber.

5. The device according to claim 4, wherein the blazed grating also functions as a mirror which illuminates an original with the EUV light.

6. The device according to claim 4, wherein:
the blazed grating is incorporated into an illumination optical system which illuminates an original with the EUV light, and the blazed grating functions as an optical integrator by forming the surface of each of the plurality of grating elements as a curved surface having a predetermined curvature.

7. The device according to claim 4, further comprising a cooler which cools the infrared light absorber.

8. A device manufacturing method of manufacturing a device, comprising:
   exposing a substrate by an exposure apparatus; and developing the exposed substrate,
   wherein the exposure apparatus comprises a wavelength separation filter configured to separate incident light into EUV light and infrared light, and an infrared light absorber which absorbs the infrared light,
   wherein the wavelength separation filter comprising a blazed grating whose cross-sectional shape is a saw-tooth shape formed by arranging a plurality of grating elements along a predetermined direction,
   wherein the blazed grating is configured to have a first power on the EUV light by gradually changing blaze angles of the plurality of grating elements along the predetermined direction in which the plurality of grating elements are arranged, and to have a second positive power of condensing the infrared light, by gradually changing lengths of the plurality of grating elements along the predetermined direction in which the plurality of grating elements are arranged.

9. A blazed grating comprising:
   a plurality of grating elements arranged along a predetermined direction to form a saw-tooth cross-sectional shape,
   wherein the blazed grating separates incident light into light having a first wavelength and light having a second wavelength different from the first wavelength, and
   wherein the blazed grating is configured to gradually change blaze angles of the plurality of grating elements along the predetermined direction in which the plurality of grating elements are arranged, and configured to gradually change lengths of the plurality of grating elements along the predetermined direction in which the plurality of grating elements are arranged, and
   wherein the blazed grating is configured to have a first power on the light having the first wavelength by gradually changing the blaze angles of the plurality of grating elements, and to have a second positive power of condensing the light having the second wavelength by gradually changing lengths of the plurality of grating elements along the predetermined direction in which the plurality of grating elements are arranged.

* * * * *